United States Patent
Nagase et al.

(10) Patent No.: US 7,602,045 B2
(45) Date of Patent: Oct. 13, 2009

(54) SEMICONDUCTOR DEVICE AND INVERTER DEVICE USING THE SAME

(75) Inventors: Takuo Nagase, Hitachi (JP); Mutsuhiro Mori, Mito (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/624,723

(22) Filed: Jan. 19, 2007

(65) Prior Publication Data

US 2007/0194346 A1 Aug. 23, 2007

(30) Foreign Application Priority Data

Feb. 21, 2006 (JP) .............................. 2006-043255

(51) Int. Cl.
*H01L 29/74* (2006.01)
*H01L 29/76* (2006.01)

(52) U.S. Cl. ............... 257/577; 257/565; 257/E27.022; 257/E27.039

(58) Field of Classification Search ................ 257/499, 257/140, 176, 104, 378, 132, 133, 139, 146, 257/147, 155, E27.022, E27.21, E27.02, 257/E27.019, E27.039, 556, 577
See application file for complete search history.

(56) References Cited

U.S. PATENT DOCUMENTS

| 4,383,268 | A | * | 5/1983 | Martinelli et al. | ........... | 257/578 |
| 5,701,018 | A | * | 12/1997 | Hanaoka et al. | ............. | 257/140 |
| 5,923,055 | A | * | 7/1999 | Schlangenotto et al. | ..... | 257/147 |
| 5,952,682 | A | * | 9/1999 | Oshino | ........................ | 257/156 |
| 6,144,046 | A | * | 11/2000 | Hanaoka et al. | ............. | 257/140 |
| 2002/0195656 | A1 | * | 12/2002 | Hattori | ........................ | 257/330 |
| 2004/0021203 | A1 | * | 2/2004 | Flohrs et al. | ................. | 257/578 |
| 2006/0138607 | A1 | * | 6/2006 | Nemoto | ........................ | 257/656 |
| 2007/0026577 | A1 | * | 2/2007 | Francis et al. | ................ | 438/133 |
| 2007/0120215 | A1 | * | 5/2007 | Yun et al. | .................... | 257/496 |

FOREIGN PATENT DOCUMENTS

| JP | 07-283401 | 10/1995 |
| JP | 09-199712 | 7/1997 |
| JP | 2001-156299 | 6/2001 |
| JP | 2002-314083 | 10/2002 |
| JP | 3687614 | 10/2002 |

* cited by examiner

*Primary Examiner*—Victor A. Mandala
*Assistant Examiner*—William Harriston
(74) *Attorney, Agent, or Firm*—Antonelli, Terry, Stout & Kraus, LLP.

(57) ABSTRACT

In a semiconductor device having a pair of IGBT and diode which are connected to each other in inverse-parallel in which a collector-electrode of the IGBT and a cathode-electrode of the diode are wired to each other, and an emitter-electrode of the IGBT and an anode-electrode of the diode are wired to each other, when a breakdown voltage of a junction of a p-type emitter layer and an n-type buffer layer of the IGBT is represented as BVec, and a forward voltage occurring while the diode transits from a state of blocking to a state of forward conduction is represented as VF, a relationship of VF<BVec is satisfied in a predetermined current value Id of a current flowing in the diode, and the maximal doping concentration of the n-type cathode layer of the diode is higher than that of the n-type buffer layer of the IGBT.

8 Claims, 7 Drawing Sheets

SEMICONDUCTOR DEVICE AND INVERTER DEVICE USING THE SAME

CROSS-REFERENCE TO RELATED APPLICATION

The present application claims priority from Japanese Patent Application No. JP 2006-043255 filed on Feb. 21, 2006, the content of which is hereby incorporated by reference into this application.

TECHNICAL FIELD OF THE INVENTION

The present invention relates to a technique for a semiconductor device. More particularly, to a technique effectively applied to a semiconductor device in which an insulated gate bipolar transistor and a diode are connected to each other in inverse-parallel (hereinafter, it is abbreviated as an IGBT module).

BACKGROUND OF THE INVENTION

An insulated gate bipolar transistor (IGBT) is a switching element controlling a current applied between a collector-electrode and an emitter-electrode by a voltage applied to a gate-electrode. A controllable power of the switching element extends from tens of watts to hundreds of thousands of watts, and a switching frequency thereof also has such a wide range from tens of kilo-hertz to more than a hundred of hertz. This feature is an advantage to widely use the IGBT for a low-power electric appliance for household use such as an air conditioner or a microwave oven and a high-power electric appliance such as a railroad or a rolling-mill driving inverter in steel plants.

The IGBT is generally used in a form of an IGBT module. The IGBT module is a semiconductor device in which an IGBT and a diode connected to each other in inverse-parallel (antiparallel) are incorporated into one package, and an electrode terminal is taken out to the outside, and the IGBT module is mainly used in an inverter device or the like.

FIG. 10 is a diagram showing an inverter using a commonly-used IGBT module. In FIG. 10, reference numerals 100a to 100f denote IGBTs, reference numerals 101a to 101f denote diodes, a reference numeral 110 denotes a motor, and a reference numeral 120 denotes a power supply. As the IGBT module, there are one in which only a pair of IGBT and diode is incorporated in one package, one in which upper arms and lower arms corresponding to one phase are incorporated therein, and one in which upper arms and lower arms corresponding to three phases are incorporated therein, which are selectively used according to usage. For achieving low loss and low cost of the inverter device, low loss and low cost of the IGBT module is required.

Regarding the achievement of low loss, recently, improvement for reducing switching loss of the IGBT is progressed. For example, it is known that, after a collector current is steeply lowered due to turn-off which becomes a main factor of switching loss, a current decreased gently like a tail (hereinafter, called as tail current) is reduced.

Regarding the achievement of low cost, it is known that not a conventional epitaxial grown silicon crystal but an inexpensive floating-zone-grown silicon crystal (FZ crystal) is used as material of IGBT and diode.

As a technique for achieving such low cost and low loss of the IGBT as described above, an IGBT structure of a conventional technique described in Japanese Patent Application Laid-Open Publication No. 2002-314083 (Patent Document 1) is shown in FIG. 11. In the structure, an FZ crystal substrate forms an n-type drift layer 1, a p-type base layer 2 having a doping concentration higher than that of the n-type drift layer 1 is selectively formed on one surface of the FZ crystal substrate, and further an n-type source layer 3 having a doping concentration higher than that of the p-type base layer 2 is selectively formed on a surface portion of the p-type base layer 2. The surface portion of the p-type base layer 2 sandwiched between the n-type drift layer 1 and the n-type source layer 3 is a channel region, a gate insulating layer 4 is disposed on an upper portion of the channel region, and an insulated gate-electrode 5 is further disposed on an upper portion of the gate insulating layer 4, so that an emitter-electrode 6 connected commonly to the p-type base layer 2 and the n-type source layer 3 is formed. Next, an n-type buffer layer 7 is formed by performing ion implantation on the other surface portion of the FZ crystal substrate, a p-type emitter layer 8 is formed by ion-implanting lightly, and a collector-electrode 9 connected to the p-type emitter layer 8 is formed.

In the IGBT, by forming the p-type emitter layer 8 thin introducing ion implantation lightly, injection of holes from the p-type emitter layer 8 can be suppressed to reduce turn-off loss at switching. The IGBT is low in cost because an inexpensive floating-zone-grown crystal (FZ crystal) is used.

SUMMARY OF THE INVENTION

Meanwhile, the present inventors found that the above-described IGBT which is the conventional technique has the following problem when an IGBT chip is incorporated into an IGBT module.

FIG. 12 is a diagram of a pair of an IGBT and a diode which are connected to each other in inverse-parallel is drawn out of the inverter extracted from FIG. 10, showing a transitional state (forward recovery) where the state of the diode is from a state of blocking to a state of forward conduction. At a forward recovery time, the diode generates voltage VF (forward recovery voltage) larger than that in a state where current steadily flows in the diode, and a reverse voltage by which the emitter side has a higher potential than which the collector side has is applied to the IGBT. At this time, if a reverse withstand voltage BVec which is a withstand voltage when the IGBT is applied with the reverse voltage is lower than the forward recovery voltage VF, junction of a p-type emitter layer and an n-type buffer layer of the IGBT is led to breakdown, and an avalanche current flows, so that loss of the IGBT is increased.

In the IGBT of the above-described background technique shown in FIG. 11, since the p-type emitter layer and the n-type buffer layer are formed by ion implantation, the p-type emitter layer and the n-type buffer layer are present at a depth of about 3 μm maximum due to the limit of an implantation depth of a current ion implanter. Therefore, there is a problem that the junction of the p-type emitter layer and the n-type buffer layer becomes steep, so that a reverse withstand voltage becomes low.

The present invention is made for solving such a problem as described above, and an object of the present invention is to provide a low-cost and low-loss semiconductor device having a pair of an IGBT and a diode which are connected to each other in inverse-parallel.

The above and other objects and novel characteristics of the present invention will be apparent from the description of this specification and the accompanying drawings.

The typical ones of the inventions disclosed in this application will be briefly described as follows.

The present invention is applied to a semiconductor device having at least one pair of an IGBT and a diode (IGBT module).

An IGBT is made of a first FZ crystal, and has a pair of principal surfaces. This insulated gate bipolar transistor (IGBT) is formed in an area including: a first region of a first conductivity type which has an exposed surface on a first principal surface; a second region of a second conductivity type formed adjacent to the first region, which has a doping concentration lower than that of the first region; a third region of the second conductivity type formed adjacent to the second region, which has an exposed surface on a second principal surface and has a doping concentration lower than that of the second region; a fourth region of the first conductivity type formed selectively on the second principal surface portion of the third region, which has a doping concentration higher than the third region; and a fifth region of the second conductivity type formed selectively on the second principal surface side of the fourth region, which has a doping concentration higher than that of the fourth region. In addition, the IGBT is provided with: an insulated gate-electrode provided via an insulating layer on exposed surfaces of the third region, the fourth region, and the fifth region of the second principal surface; a collector-electrode brought into low-resistive contact with an exposed surface of the first region; and an emitter-electrode which short-circuits the fourth region and the fifth region on the second principal surface.

A diode is made of a second FZ crystal and has a pair of principal surfaces. The diode is formed in an area including: a sixth region of the second conductivity type which has an exposed surface on a third principal surface; a seventh region of the second conductivity type formed adjacent to the sixth region, which has a doping concentration lower than that of the sixth region; and an eighth region of the first conductivity type formed adjacent to the seventh region, which has an exposed surface on a fourth principal surface and a doping concentration higher than that of the seventh region. In addition, the diode is provided with a cathode-electrode brought into low-resistive contact with the sixth region and an anode-electrode brought into low-resistive contact with the eighth region.

In the configuration of the semiconductor device, when it is made to have these conditions: the collector-electrode and the cathode-electrode are wired to each other; the emitter-electrode and the anode-electrode are wired to each other; a breakdown voltage of a junction of the first region and the second region of the IGBT is represented as BVec; and a forward voltage drop occurring while the state of the diode transits from a state of blocking to a state of forward conduction is represented as VF, it is only necessary to satisfy a relationship of VF<BVec for a predetermined current value Id of a current flowing in the diode, and make the maximal doping concentration of the sixth region of the diode higher than that of the second region of the insulated gate bipolar transistor.

A particularly preferable structure can be obtained by setting the maximal doping concentration of the second region of the IGBT to equal to $3E16$ $cm^{-3}$ or less, and setting the maximal doping concentration of the sixth region of the diode to equal to $1E17$ $cm^{-3}$ or more.

In order to enhance the advantage of the present invention, in the IGBT, it is preferable to form, between the first region and the second region, a ninth region of the second conductivity type whose thickness is not less than 0.5 μm and not more than 3 μm and whose doping concentration is not more than $1E16$ $cm^{-3}$. In the diode, it is preferable to form, between the sixth region and the seventh region, a tenth region of the second conductivity type whose thickness is not less than 0.5 μm and not more than 3 μm, and whose doping concentration is not more than $1E16$ $cm^{-3}$.

Regarding a manufacturing method, it is preferable to form either one of the first region, the second region, and the ninth region of the IGBT by performing ion implantation from the first principal surface and irradiating the first principal surface with laser. It is preferable to form either one of the sixth region and the tenth region of the diode by performing ion implantation from the third principal surface and irradiating the third principal surface with laser.

The effects obtained by typical aspects of the present invention will be briefly described below.

According to the present invention, since an avalanche current is prevented from flowing due to breakdown of the IGBT when a reverse voltage is applied to a low-cost and low-loss IGBT using a floating-zone-grown crystal, low cost and low loss of a semiconductor device having a pair of an IGBT and a diode connected to each other in inverse-parallel can be achieved.

BRIEF DESCRIPTIONS OF THE DRAWINGS

FIG. 2-1 is a diagram showing a step 1 in a manufacturing method of the IGBT in the semiconductor device of the embodiment applied with the present invention;

FIG. 2-2 is a diagram showing a step 2 in a manufacturing method of the IGBT in the semiconductor device of the embodiment applied with the present invention;

FIG. 2-3 is a diagram showing a step 3 in a manufacturing method of the IGBT in the semiconductor device of the embodiment applied with the present invention;

FIG. 2-4 is a diagram showing a step 4 in a manufacturing method of the IGBT in the semiconductor device of the embodiment applied with the present invention;

FIG. 2-5 is a diagram showing a step 5 in a manufacturing method of the IGBT in the semiconductor device of the embodiment applied with the present invention;

FIG. 2-6 is a diagram showing a step 6 in a manufacturing method of the IGBT in the semiconductor device of the embodiment applied with the present invention;

FIG. 3-1 is a diagram showing a step 1 in a manufacturing method of the diode in the semiconductor device of the embodiment applied with the present invention;

FIG. 3-2 is a diagram showing a step 2 in a manufacturing method of the diode in the semiconductor device of the embodiment applied with the present invention;

FIG. 3-3 is a diagram showing a step 3 in a manufacturing method of the diode in the semiconductor device of the embodiment applied with the present invention;

FIG. 3-4 is a diagram showing a step 4 in a manufacturing method of the diode in the semiconductor device of the embodiment applied with the present invention;

FIG. 3-5 is a diagram showing a step 5 in a manufacturing method of the diode in the semiconductor device of the embodiment applied with the present invention;

FIG. 3-6 is a diagram showing a step 6 in a manufacturing method of the diode in the semiconductor device of the embodiment applied with the present invention;

FIG. 4 is a graph showing a relationship between a doping concentration and a reverse withstand voltage of an n-type buffer layer of the IGBT in the semiconductor device of the embodiment applied with the present invention;

FIG. 5 is a graph showing a relationship between a doping concentration and a forward recovery voltage of an n-type cathode layer of the diode in the semiconductor device of the embodiment applied with the present invention;

FIG. 6 is a diagram showing a sectional structure of an IGBT which improves an advantage of the present invention in the semiconductor device of the embodiment applied with the present invention;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Figure 1:
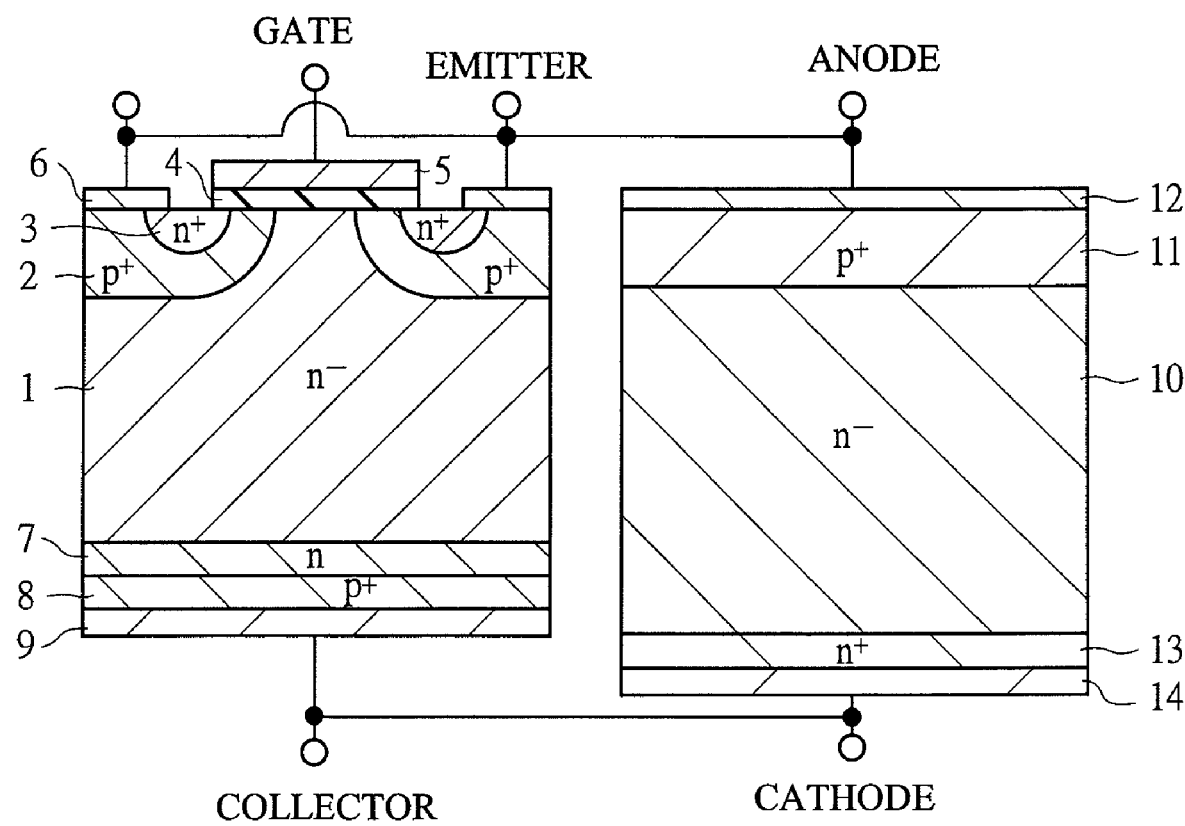
FIG. 1 is a diagram showing a sectional structure and a connection relationship of an IGBT and a diode in a semiconductor device of an embodiment applied with the present invention.

FIG. 1 shows a sectional structure and a connection relationship of an IGBT and a diode in a semiconductor device (IGBT module) of an embodiment applied with the present invention.

The semiconductor device of the embodiment includes one pair of an IGBT and a diode.

The IGBT is composed of a first FZ crystal, and has a pair of principal surfaces and an exposed surface on a first principal surface on a collector-electrode side. Incidentally, a second principal surface is positioned on an insulated gate-electrode side.

This IGBT is formed in an area including: a p-type emitter layer (first region) 8; an n-type buffer layer (second region) 7 formed adjacent to the p-type emitter layer 8, which has a doping concentration lower than that of the p-type emitter layer 8; an n-type drift layer (third region) 1 formed adjacent to the n-type buffer layer 7, which has an exposed surface on the second principal surface and a doping concentration lower than that of the n-type buffer layer 7; a p-type base layer (fourth region) 2 formed selectively on the second principal surface portion of the n-type drift layer 1, which has a doping concentration higher than that of the n-type drift layer 1; and an n-type source layer (fifth region) 3 formed selectively on the second principal surface side of the p-type base layer 2, which has a doping concentration higher than that of the p-type base layer 2.

The IGBT is provided with an insulated gate-electrode 5 provided via a gate insulating layer 4 on exposed surfaces of the n-type drift layer 1, the p-type base layer 2, and the n-type source layer 3 in the second principal surface; a collector-electrode 9 brought into low-resistive contact with an exposed surface of the p-type emitter layer 8; and an emitter-electrode 6 which short-circuits the p-type base layer 2 and the n-type source layer 3 on the second principal surface.

The diode is composed of a second FZ crystal, and has a pair of principal surfaces and an exposed surface on a third principal surface on a cathode-electrode side. Incidentally, a fourth principal surface is on an anode-electrode side.

The diode is formed in an area including: an n-type cathode layer (sixth region) 13; an n-type drift layer (seventh region) 10 formed adjacent to the n-type cathode layer 13, which has a doping concentration lower than that of the n-type cathode layer 13; and a p-type anode layer (eighth region) 11 formed adjacent to the n-type drift layer 10, which has an exposed surface on the fourth principal surface and a doping concentration higher than that of the n-type drift layer 10.

The diode is provided with a cathode-electrode 14 brought into low-resistive contact with the n-type cathode layer 13, and an anode-electrode 12 brought into low-resistive contact with the p-type anode layer 11.

In the configuration of the semiconductor device, the collector-electrode 9 of the IGBT and the cathode-electrode 14 of the diode are wired to each other, and the emitter-electrode 6 of the IGBT and the anode-electrode 12 of the diode are wired to each other.

FIG. 2-1 to FIG. 2-6 and FIG. 3-1 to FIG. 3-6 are diagrams showing a manufacturing method of the IGBT and a manufacturing method of the diode in the semiconductor device of the embodiment.

First, the manufacturing method of the IGBT is described below along FIG. 2-1 to FIG. 2-6.

(2-1) An n-type drift layer 1 is formed on an FZ crystal substrate.

(2-2) Next, a p-type base layer 2 having a doping concentration higher than that of the n-type drift layer 1 is selectively formed on a surface of the FZ crystal substrate, and further an n-type source layer 3 having a doping concentration higher than that of the p-type base layer 2 is selectively formed on a surface portion in the region of the p-type base layer 2. Then, the p-type base layer 2 sandwiched between the n-type drift layer 1 and the n-type source layer 3 is taken as a channel region. On the p-type base layer 2, a gate insulating layer 4 is disposed on a surface portion, an insulated gate-electrode 5 is further disposed on the gate insulating layer 4. And, an aluminum emitter-electrode 6 connected to the p-type base layer 2 and the n-type source layer 3 commonly is formed.

(2-3) Next, backgrinding on the FZ crystal substrate is performed to make the substrate into a desired thickness.

(2-4) Thereafter, an n-type buffer layer 7 is formed by performing ion implantation of phosphorus or arsenic from the back surface of the FZ crystal substrate.

(2-5) Thereafter, a p-type emitter layer 8 is formed by performing ion implantation of boron or $BF_2$ lightly, and impurities ion-implanted are annealed to activate the same.

(2-6) Then, a collector-electrode 9 connected to the p-type emitter layer 8 is formed.

Here, the annealing process of the n-type buffer layer 7 and the p-type emitter layer 8 is performed after formation of the aluminum emitter-electrode 6. This is because the wafer becomes thin after grinding of the FZ crystal substrate, so that it becomes impossible to form a pattern of the emitter-electrode 6 at a photolithography step.

Subsequently, the diode manufacturing method is described below along FIG. 3-1 to FIG. 3-6.

(3-1) An FZ crystal substrate forms an n-type drift layer 10.

(3-2) Next, a p-type anode layer 11 having a doping concentration higher than that of the n-type drift layer 10 is formed on a surface of the FZ crystal substrate, and an aluminum anode-electrode 12 connected to the p-type anode layer 11 is formed.

(3-3) Next, backgrinding on the FZ crystal substrate is performed to make the substrate into a desired thickness.

(3-4) Thereafter, an n-type cathode layer 13 is formed by performing ion implantation of phosphorus or arsenic from the back surface of the FZ crystal substrate, and impurities ion-implanted are annealed to activate the same.

(3-5) and (3-6) Then, a cathode-electrode 14 connected to the n-type cathode layer 13 is formed.

Here, the annealing process of the n-type cathode layer 13 is performed after formation of the aluminum anode-electrode 12, which is similar to that in the IGBT manufacturing method described above. This is because, the wafer becomes thin after grinding of the FZ crystal substrate, so that it becomes impossible to form a pattern of the anode-electrode at a photolithography step.

In the IGBT and the diode described above, the collector-electrode 9 of the IGBT and the cathode-electrode 14 of the diode are connected to each other, and the emitter-electrode 6 of the IGBT and the anode-electrode 12 of the diode are connected to each other, namely, the IGBT and the diode are connected to each other in inverse-parallel.

The result of the study by the present inventors on the semiconductor device of the present embodiment is described below.

Figure 12:
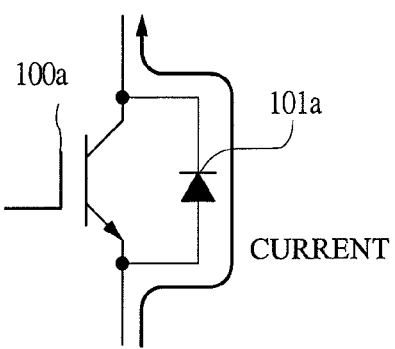
FIG. 12 is a diagram showing a flow of a current at forward recovery time of a diode in a pair of an IGBT and the diode connected to each other in inverse-parallel in FIG. 10.

As described above, at forward recovery time of the diode shown in FIG. 12, the diode generates a voltage VF (forward recovery voltage) larger than that in a state where current flows steadily, and a reverse voltage by which the emitter side has a higher potential than that of the collector side is applied to the IGBT. At this time, if a reverse withstand voltage BVec which is a withstand voltage when the IGBT is applied with the reverse voltage is lower than the forward recovery voltage VF, junction of the p-type emitter layer 8 and the n-type buffer layer 7 of the IGBT is led to breakdown and an avalanche current flows, so that loss of the IGBT is increased. In order to prevent this problem, it is only necessary to make the structures of the IGBT and the diode to satisfy VF<BVec.

The reverse withstand voltage of the IGBT is equal to the breakdown voltage of the junction of the p-type emitter layer 8 and the n-type buffer layer 7. Here, since the doping concentration of the p-type emitter layer 8 is a sufficiently high concentration as compared with that of the n-type buffer layer 7, a depletion zone mainly extends to the n-type buffer layer 7 at reverse voltage application time.

Figures 1, 2:
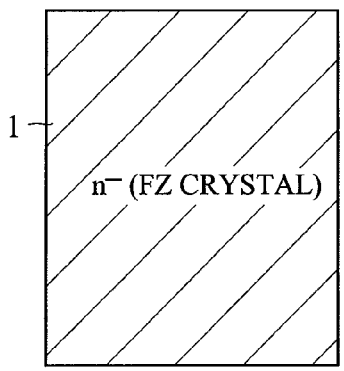
Figure 2:
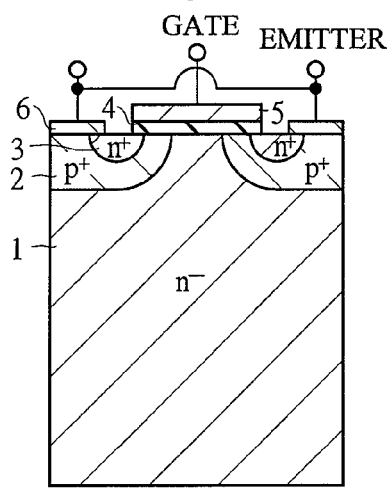
Figures 2, 3:
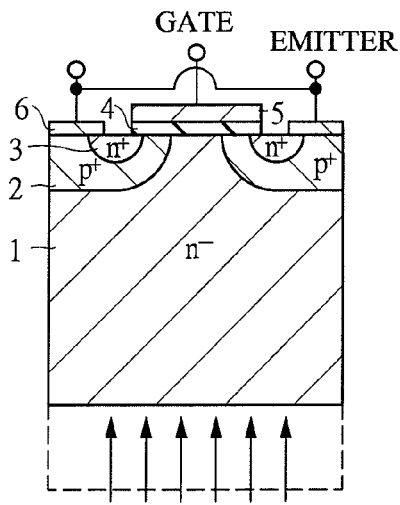
Figures 2, 3, 4:
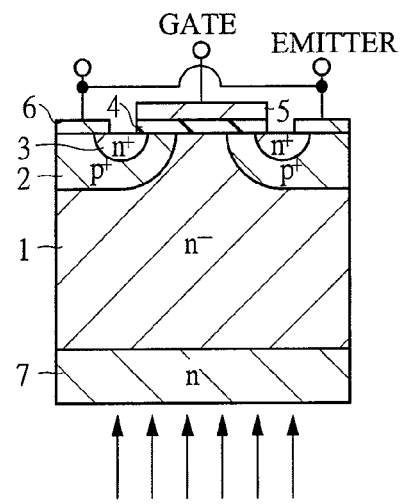

Therefore, the reverse withstand voltage depends on the doping concentration of the n-type buffer layer 7. FIG. 4 is a graph obtained by calculating a relationship between the doping concentration of the n-type buffer layer 7 of the IGBT and the reverse withstand voltage BVec. Note that, in a doping concentration, for example, "1E+16" is the same value as "1E16" and "$1 \times 10^{16}$". The concentration of the n-type buffer layer 7 is made homogeneous in the n-type buffer layer 7. From FIG. 4, it can be understood that the higher the doping concentration of the n-type buffer layer 7 is, the steeper the junction of the p-type emitter layer 8 and the n-type buffer layer 7 becomes, thereby the reverse withstand voltage BVec is lowered.

Figures 2, 3, 4, 5:
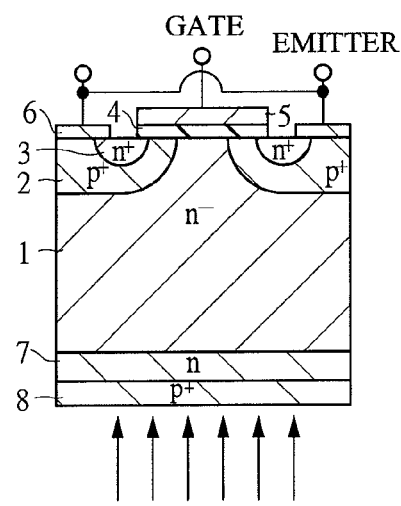

FIG. 5 shows a relationship between the doping concentration of the n-type cathode layer 13 of the diode and the forward recovery voltage VF. The doping concentration of the n-type cathode layer 13 is made homogeneous in the n-type cathode layer 13. It can be understood that, at diode conduction time, injection of electron from the cathode-electrode 14 side is accelerated by increasing the doping concentration of the n-type cathode layer 13, thereby the forward recovery voltage VF is reduced.

According to the description above, in order to achieve the condition of VF<BVec, it is desired to make the doping concentration of the n-type cathode layer 13 higher than that of the n-type buffer layer 7 of the IGBT.

Preferred structural conditions of the diode and the IGBT for satisfying the abovedescribed condition of VF<BVec are described below.

From FIG. 5, since the forward recovery voltage VF rapidly increases when the doping concentration of the n-type cathode layer 13 of the diode is less than or equal to 1E17 $cm^{-3}$, it is desired that the doping concentration of the n-type cathode layer 13 to be more than or equal to 1E17 $cm^{-3}$. In this case, the forward recovery voltage VF is 24 V.

From FIG. 4, since the reverse withstand voltage BVec satisfies more than or equal to 24 V when the doping concentration of the n-type buffer layer 7 of the IGBT is less than or equal to 3E16 $cm^{-3}$, it is desired that the doping concentration of the n-type buffer layer 7 to be less than or equal to 3E16 $cm^{-3}$.

Figures 2, 3, 4, 5, 6:
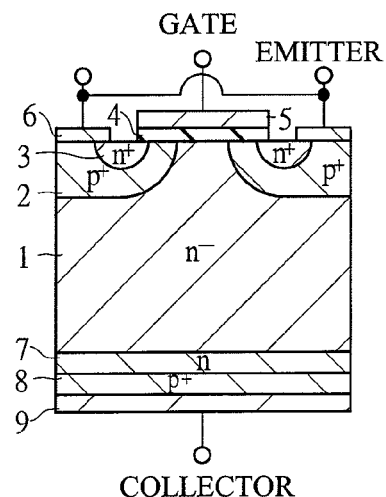
Figures 1, 3:
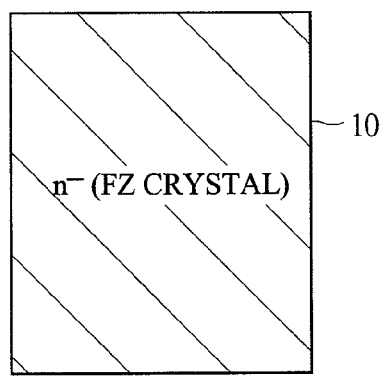
Figures 2, 3:
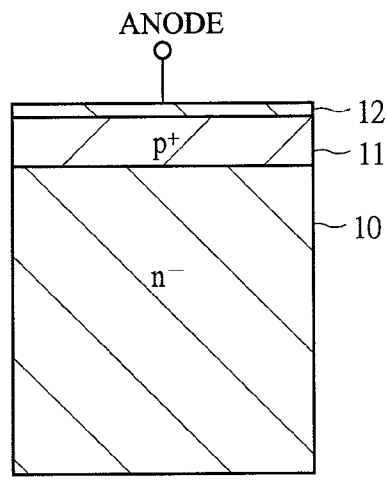
Figure 3:
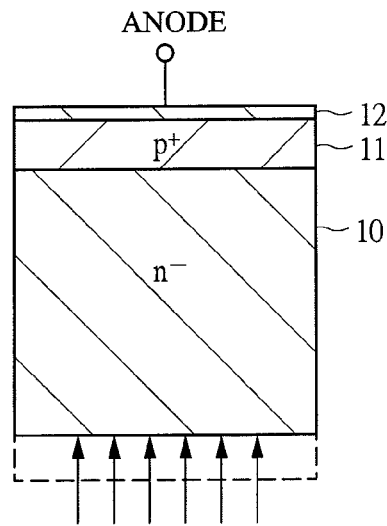
Figures 3, 4:
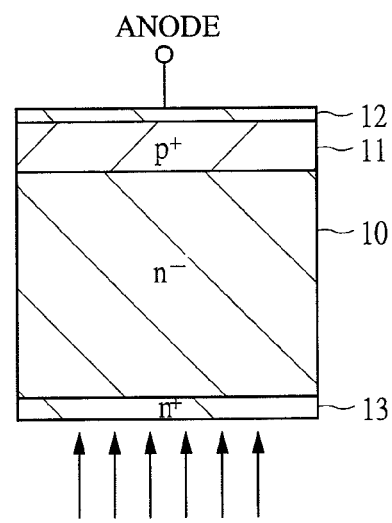
Figures 3, 4, 5:
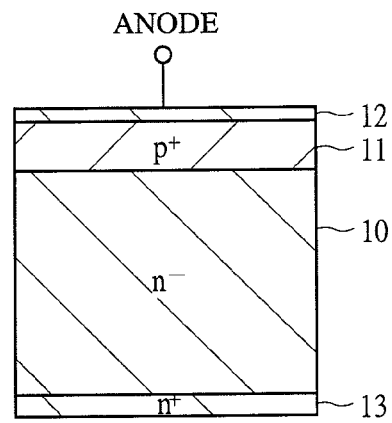
Figures 3, 4, 5, 6:
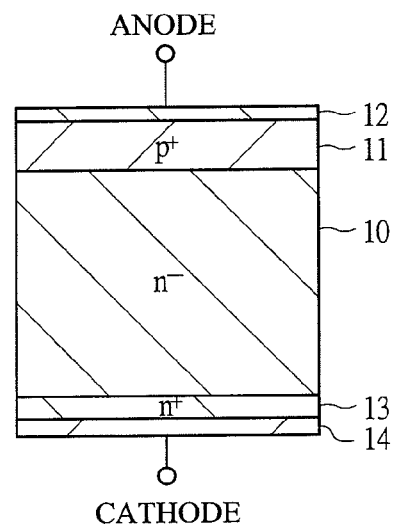
Figure 4:
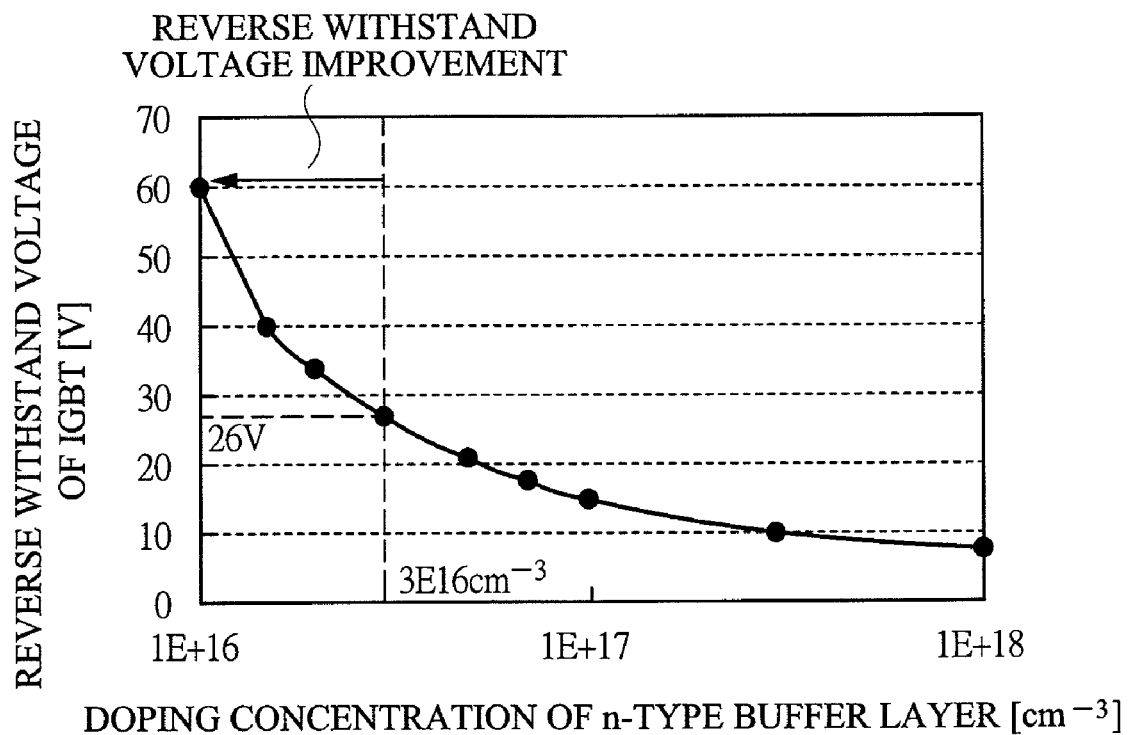
Figure 5:
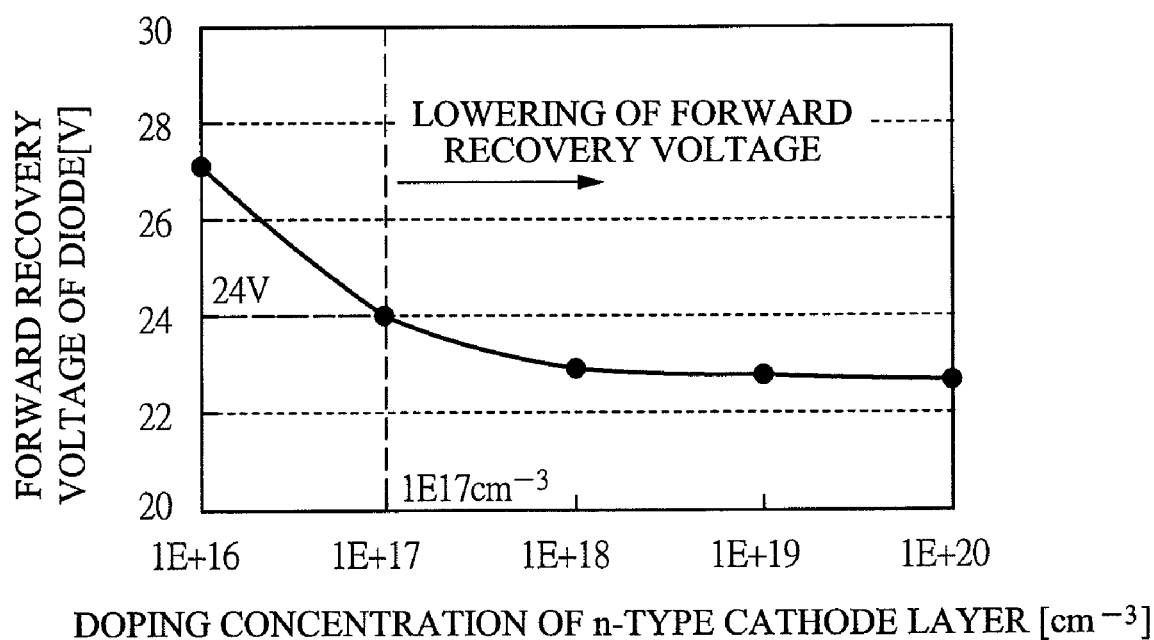
Figure 6:
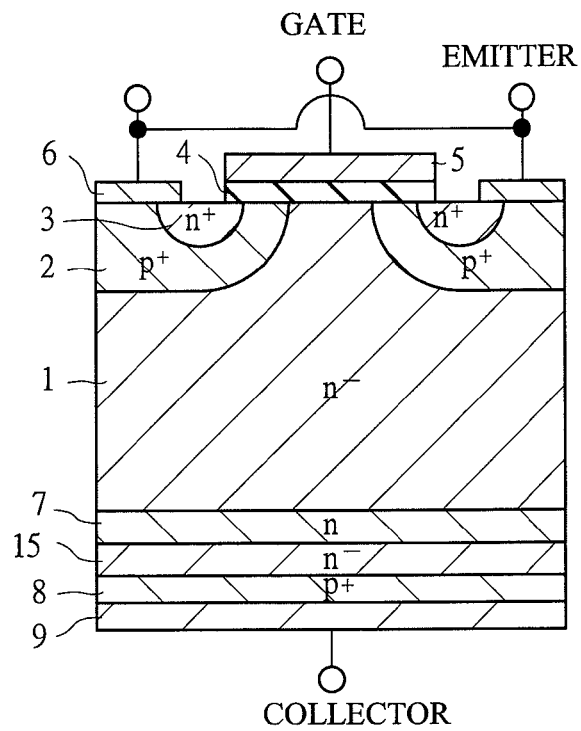
Figure 7:
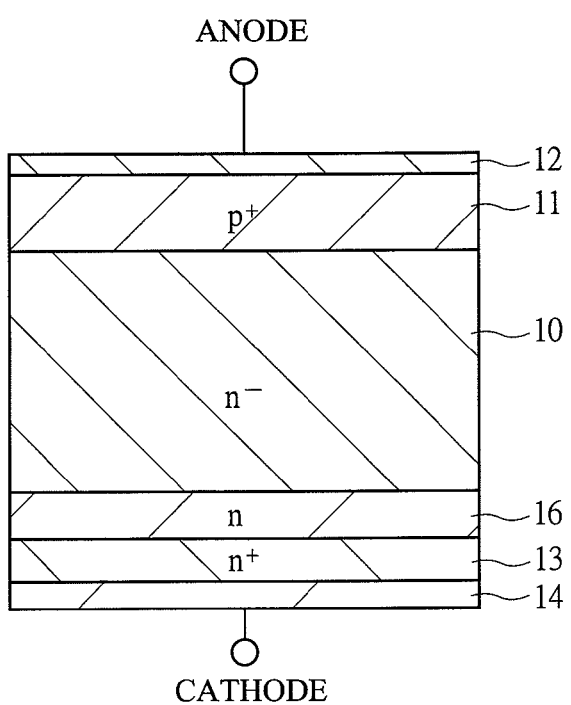
FIG. 7 is a diagram showing a sectional structure of a diode which improves an advantage of the present invention in the semiconductor device of the embodiment applied with the present invention.

Further, structures of the IGBT and the diode which improve the advantage of the present invention are shown in FIG. 6 and FIG. 7. FIG. 6 is a diagram showing a sectional structure of the IGBT. FIG. 7 is a diagram showing a sectional structure of the diode.

In order to improve the reverse withstand voltage of the IGBT, it is only necessary to relax the junction of the p-type emitter layer 8 and the n-type buffer layer 7. It is effective to insert an n-type interposing layer (ninth region) 15 having a concentration lower than that of the n-type buffer layer 7 between the n-type buffer layer 7 and the p-type emitter layer 8, as shown in FIG. 6. According to the examination of the present inventors, it is found that the n-type interposing layer 15 can be formed stably when the thickness thereof is equal to or more than 0.5 μm, and the effect of improvement of the reverse withstand voltage is obtained. However, the maximal depth of the n-type interposing layer 15 is equal to or less than 3 μm due to the limit of the implantation depth of the current ion implanter.

Figure 8:
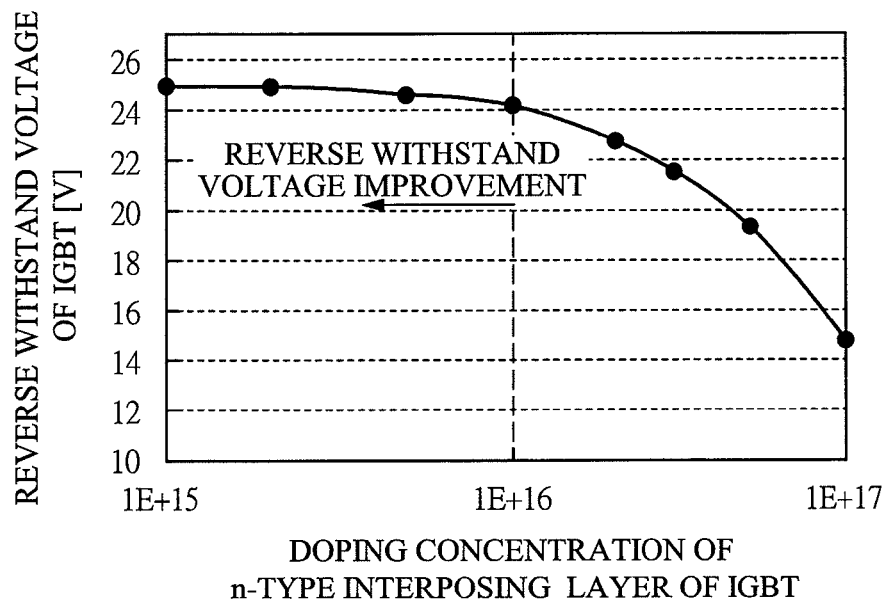
FIG. 8 is a graph showing a relationship between a doping concentration and a reverse withstand voltage of an n-type interposing layer of the IGBT in the semiconductor device of the embodiment applied with the present invention.

In FIG. 8 shown a doping concentration dependence of the n-type interposing layer 15 of the reverse withstand voltage BVec when the thickness of the n-type interposing layer 15 is 0.5 μm. From the result, since an effect of the reverse withstand voltage improvement is prominent when the doping concentration of the n-type interposing layer 15 is less than or equal to 1E16 $cm^{-3}$, it can be understood that it is desired that the concentration of the n-type interposing layer 15 to be less than or equal to 1E16 $cm^{-3}$.

In the abovedescribed structure, the following method can be considered in order to form the n-type interposing layer 15 between the p-type emitter layer 8 and the n-type buffer layer 7.

The n-type buffer layer 7 is subjected to ion implantation of phosphorus using high energy of more than or equal to 200 keV, and formed separated from the p-type emitter layer 8. Ion implantation of p-type boron having a concentration to negate n-type donor of the n-type buffer layer 7 is performed in the range of 0.5 μm from the junction of the p-type emitter layer 8 and the n-type buffer layer 7 to form the n-type interposing layer 15 having a low concentration.

In the diode, as shown in FIG. 7, it is effective to insert, between the n-type drift layer 10 and the n-type cathode layer 13, an n-type interposing layer (tenth region) 16 having a concentration which is higher than that of the n-type drift layer 10 and lower than that of the n-type cathode layer 13. The following is the reason.

It has been known that, when the n-type drift layer 10 is thin in the diode, when a depletion zone extending from a pn junction of anode-side reaches the n-type cathode layer 13, carriers are suddenly swept out at reverse voltage application time, and current is suddenly cut off, thereby noise is generated as described in Japanese Patent No. 3248383.

Therefore, the n-type drift layer 10 of the diode must be made thicker than the IGBT which has the same withstand voltage. Here, reaching the n-type cathode layer 13 suddenly can be prevented by providing, between the n-type cathode layer 13 and the n-type drift layer 10, the n-type interposing layer 16 having a concentration lower than that of the n-type cathode layer 13, like the diode shown in FIG. 7. Therefore, the n-type drift layer 10 can be made thin, so that the forward recovery voltage VF can be reduced.

According to the examination of the present inventors, the diode can be formed stably when the thickness of the n-type interposing layer 16 is more than or equal to 0.5 μm, so that noise at reverse voltage application time can be reduced. However, the maximal depth of the diode is equal to or less than 3 μm due to the limit of the implantation depth of the current ion implanter.

The present inventors found that noise at reverse voltage application time can be reduced when the doping concentration of the n-type interposing layer 16 is less than or equal to 1E16 cm$^{-3}$, so that the n-type drift layer 10 can be made thin, and the forward recovery voltage VF can be reduced.

In the abovedescribed structure, in order to form the n-type interposing layer 16 between the n-type drift layer 10 and the n-type cathode layer 13, it is only necessary to make the energy at the time of ion implantation to the n-type interposing layer 16 larger than that at the time of ion implantation to the n-type cathode layer 13.

Figure 9:
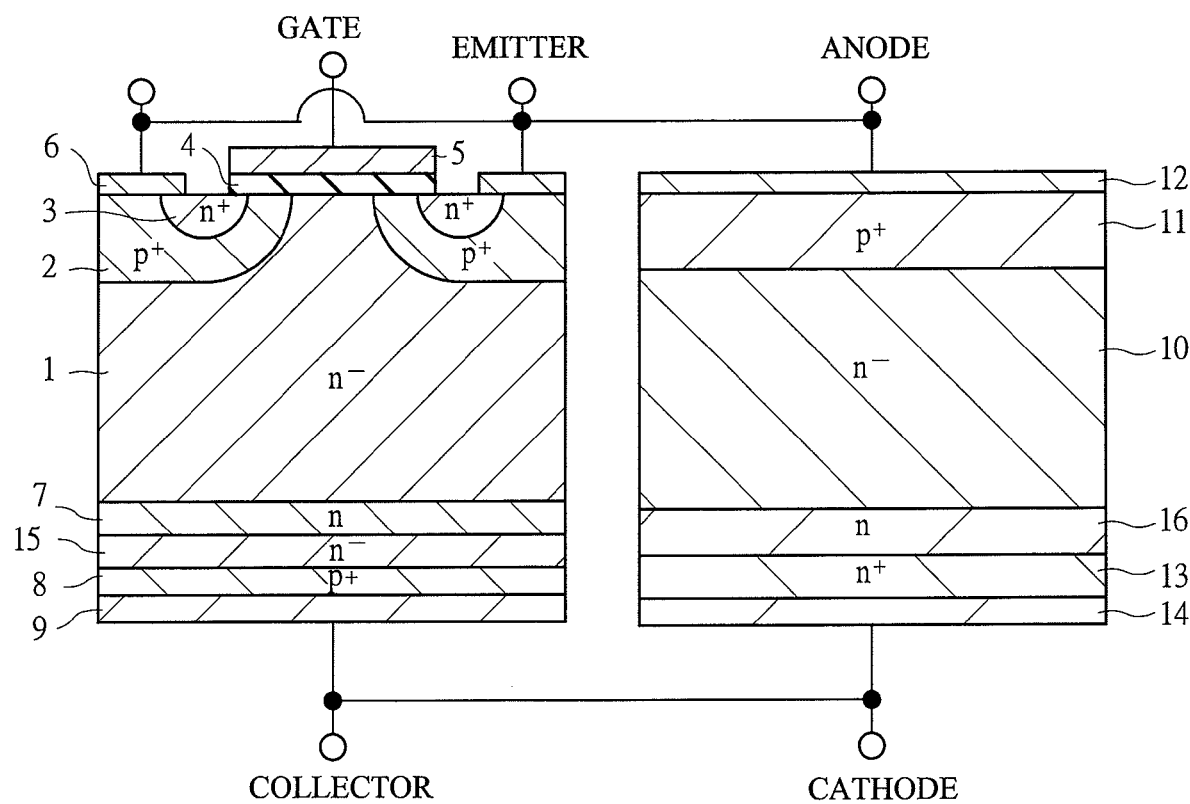
FIG. 9 is a diagram showing a sectional structure and a connection relationship of an IGBT and a diode provided with an n-type interposing layer in a semiconductor device of an embodiment applied with the present invention.
Figure 10:
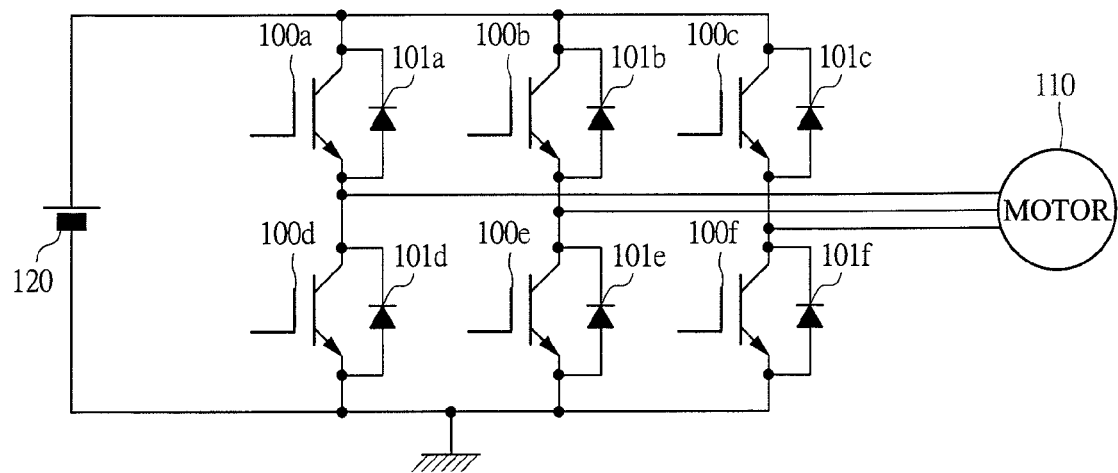
FIG. 10 is a diagram showing an inverter using a commonly-used IGBT module.
Figure 11:
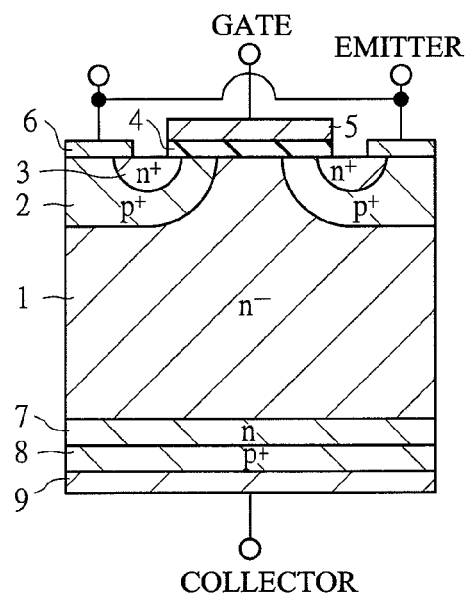
FIG. 11 is a diagram showing a cross sectional structure of an IGBT of a conventional technique.

The advantage of the present invention is further enhanced by using the IGBT provided with the abovedescribed n-type interposing layer 15 and the diode provided with the n-type interposing layer 16 in combination, as shown in FIG. 9.

Further, it is advantageous to irradiate an ion implanted layer with a laser whose wavelength is 240 nm to 1070 nm, and whose half width is 100 to 500 ns at the step of annealing a layer formed by ion implantation to activate impurities in the manufacturing methods of the IGBT and diode of the present invention. The following is the reason.

In the manufacturing method of the IGBT of the present invention using the floating-zone-grown crystal, the annealing process of the n-type buffer layer 7 and the p-type emitter layer 8 is performed after formation of the aluminum emitter-electrode 6, as described above, thereby a temperature cannot be made higher than or equal to 450° C. in a normal furnace annealing.

A failure due to a spike of the aluminum electrode occurs at a temperature higher than or equal to 450° C. However, in annealing of lower than or equal to 450° C., an activation rate when ion implantation of, for example, boron is performed with a dose of 1E15 cm$^{-2}$ to perform annealing is 2% or less, which is low.

By using an annealing method of irradiating the n-type buffer layer 7 and the p-type emitter layer 8 which are subjected to ion implantation with a pulse laser whose wavelength is 240 nm to 1070 nm, and whose half width is 100 to 500 ns, only an ion implanted layer can be applied with a heat history without raising a temperature of the emitter-electrode 6 positioned on the other surface, and the activation rate when ion implantation of boron is performed by a dose of 1E15 cm$^{-2}$ to perform annealing becomes equal to 60% or more.

Since the activation rate is low when the n-type buffer layer 7 and the p-type emitter layer 8 of the IGBT is annealed at a temperature of less than or equal to 450° C., leakage current of the junction of the p-type emitter layer 8 and the n-type buffer layer 7 at reverse voltage application time is increased, thereby loss is increased. Since the activation rate becomes high and the leakage current becomes low when the annealing is performed with abovementioned laser whose wavelength is 240 nm to 1070 nm and whose half width is 100 to 500 ns, loss is reduced. Thereby, it is preferred to perform annealing by irradiating the n-type buffer layer 7 and the p-type emitter layer 8 which are subjected to ion implantation with the laser.

About the diode, when the n-type cathode layer 13 is annealed at a temperature of less than or equal to 450° C., the activation rate is low, thereby the doping concentration of the n-type cathode layer 13 does not reach a sufficient doping concentration. However, by irradiating the n-type cathode layer 13 with the laser whose wavelength is 240 nm to 1070 nm and whose half-value width is 100 to 500 ns to anneal the same, the doping concentration thereof can reach a sufficient doping concentration, so that the forward recovery voltage VF can be reduced.

As explained above, according to the semiconductor device of the present embodiment, when a reverse voltage is applied to the low-cost and low-loss IGBT using the floating-zone-grown crystal, an avalanche current due to breakdown of the IGBT can be prevented from flowing. As a result, low cost and low loss of the semiconductor device having a pair of IGBT and diode connected to each other in inverse-parallel can be achieved.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the embodiment described above, the structures of the n-type buffer layer 7 and the p-type emitter layer 8 of the IGBT and the structure of the n-type cathode layer 13 of the diode for satisfying VF<BVec in the IGBT and the diode which have withstand voltages of 1200 V were examined. However, the present invention can be applied to another IGBT and another diode which have a withstand voltages of 600 V to 6.5 kV. This is because the conditions of the n-type buffer layer and the p-type emitter layer of the IGBT and the n-type cathode layer of the diode do not have a specific dependence to the withstand voltage.

The present invention is also applicable similarly to such an inverter as shown in FIG. 1 using the semiconductor device (IGBT module) of the embodiment described above.

The present invention relates to a technique of a semiconductor device, in particular, the present invention can be utilized for an IGBT module in which an IGBT and a diode are connected to each other in inverse-parallel, further, for an inverter and the like using an IGBT module.

What is claimed is:

1. The semiconductor device having at least one pair of an insulated gate bipolar transistor and a diode,
   wherein the insulated gate bipolar transistor is comprised of a first FZ crystal (Floating-Zone-Grown Silicon Crystal) and has a pair of principal surfaces,
   the insulated gate bipolar transistor is formed in an area including: a first region of a first conductivity type which has an exposed surface on a first principal surface; a second region of a second conductivity type formed adjacent to the first region, which has a doping concentration lower than that of the first region; a third region of the second conductivity type formed adjacent to the second region, which has an exposed surface on a second principal surface and a doping concentration lower than that of the second region; a fourth region of the first conductivity type formed selectively on the second principal surface portion of the third region, which has a doping concentration higher than that of the third region; and a fifth region of the second conductivity type formed selectively on the second principal surface side of the fourth region, which has a doping concentration higher than that of the fourth region, and the insulated gate bipolar transistor comprises: an insulated gate-electrode provided via an insulating layer on exposed surfaces of the third region, the fourth region, and the fifth region in the second principal surface; a collector-electrode brought into low-resistive contact with an exposed surface of the first region; and an emitter-electrode which shod-circuits the fourth region and the fifth region on the second principal surface, and wherein the diode is comprised of a second FZ crystal and has a pair of principal surfaces, the diode is formed in an area including: a sixth region of the second conductivity type which has an exposed surface on a third principal surface; a seventh region of the second conductivity type formed adjacent to the sixth region, which has a doping concentration lower than that of the sixth region; and an eighth region of the first conductivity type formed adjacent to the seventh region, which has an exposed surface on a fourth principal surface and a doping concentration higher than that of the seventh region, and the diode has a cathode-electrode brought into low-resistive contact with the sixth region and an anode-electrode brought into low-resistive contact with the eighth region, wherein the collector-electrode and the cathode-electrode are wired to each other and the emitter-electrode and the anode-electrode are wired to each other, and when a breakdown voltage of a junction of the first region and the second region of the insulated gate bipolar transistor is represented as BVec, and a forward voltage occurring while the diode transits from a state of blocking to a state of forward conduction is represented as VF, a relationship of VF<BVec is satisfied in a predetermined current value Id of a current flowing in the diode, and the maximal doping concentration of the sixth region of the diode is higher than that of the second region of the insulated gate bipolar transistor, wherein the maximal doping concentration of the second region of the insulated gate bipolar transistor is equal to or less than $3E16$ $cm^{-3}$, and the maximal doping concentration of the sixth region of the diode is equal to or more than $1E17$ $cm^{-3}$.

2. The semiconductor device having at least one pair of an insulated gate bipolar transistor and a diode, wherein the insulated gate bipolar transistor is comprised of a first FZ crystal (Floating-Zone-Grown Silicon Crystal) and has a pair of principal surfaces, the insulated gate bipolar transistor is formed in an area including: a first region of a first conductivity type which has an exposed surface on a first principal surface; a second region of a second conductivity type formed adjacent to the first region, which has a doping concentration lower than that of the first region; a third region of the second conductivity type formed adjacent to the second region, which has an exposed surface on a second principal surface and a doping concentration lower than that of the second region; a fourth region of the first conductivity type formed selectively on the second principal surface portion of the third region which has a doping concentration higher than that of the third region; and a fifth region of the second conductivity type formed selectively on the second principal surface side of the fourth region, which has a do in concentration higher than that of the fourth region, and the insulated gate bipolar transistor comprises: an insulated gate-electrode provided via an insulating layer on exposed surfaces of the third region, the fourth region, and the fifth region in the second principal surface; a collector-electrode brought into low-resistive contact with an exposed surface of the first region; and an emitter-electrode which short-circuits the fourth region and the fifth region on the second principal surface, and wherein the diode is comprised of a second FZ crystal and has a pair of principal surfaces, the diode is formed in an area including: a sixth region of the second conductivity type which has an exposed surface on a third principal surface; a seventh region of the second conductivity type formed adjacent to the sixth region, which has a doping concentration lower than that of the sixth region; and an eighth region of the first conductivity type formed adjacent to the seventh region, which has an exposed surface on a fourth principal surface and a doping concentration higher than that of the seventh region, and the diode has a cathode-electrode brought into low-resistive contact with the sixth region and an anode-electrode brought into low-resistive contact with the eighth region, wherein the collector-electrode and the cathode-electrode are wired to each other, and the emitter-electrode and the anode-electrode are wired to each other, and when a breakdown voltage of a unction of the first region and the second region of the insulated gate bipolar transistor is represented as BVec, and a forward voltage occurring while the diode transits from a state of blocking to a state of forward conduction is represented as VF, a relationship of VF<BVec is satisfied in a predetermined current value Id of a current flowing in the diode, and the maximal doping concentration of the sixth region of the diode is higher than that of the second region of the insulated gate bipolar transistor, wherein a ninth region of the second conductivity type whose thickness is not less than 0.5 μm and not more than 3 μm and whose doping concentration is not more than $1E16$ $cm^{-3}$ is provided between the first region and the second region of the insulated gate bipolar transistor.

3. The semiconductor device according to claim 2, wherein either one of the first region, the second region, and the ninth region of the insulated gate bipolar transistor is formed by performing ion implantation from the first principal surface, and irradiating the first principal surface with a laser.

4. The semiconductor device having at least one air of an insulated gate bipolar transistor and a diode, wherein the insulated gate bipolar transistor is comprised of a first FZ crystal (Floating-Zone-Grown Silicon Crystal) and has a pair of principal surfaces, the insulated gate bipolar transistor is formed in an area including: a first region of a first conductivity type which has an exposed surface on a first principal surface; a second region of a second conductivity type formed adjacent to the first region, which has a doping concentration lower than that of the first region; a third region of the second conductivity type formed adjacent to the second region, which has an exposed surface on a second principal surface and a doping concentration lower than that of the second region; a fourth region of the first conductivity type formed selectively on the second principal surface portion of the third region, which has a doping concentration higher than that of the third region; and a fifth region of the second conductivity type formed selectively on the second principal surface side of the fourth region, which has a doping concentration higher than that of the fourth region, and the insulated gate bipolar transistor comprises: an insulated gate-electrode provided via an insulating layer on exposed surfaces of the third region, the fourth region, and the fifth region in the second principal surface; a collector-electrode brought into low-resistive contact with an exposed surface of the first region; and an emitter-electrode which shod-circuits the fourth region and the fifth region on the second principal surface, and wherein the diode is comprised of a second FZ crystal and has a pair of principal surfaces, the diode is formed in an area including: a sixth region of the second conductivity type which has an exposed surface on a third principal surface; a seventh region of the second conductivity type formed adjacent to the sixth region, which has a doping concentration lower than that of the sixth region; and an eighth region of the first conductivity type formed adjacent to the seventh region, which has an exposed surface on a fourth principal surface and a doping concentration higher than that of the seventh region, and the diode has a cathode-electrode brought into low-resistive contact with the sixth region and an anode-electrode brought into low-resistive contact with the eighth region, wherein the collector-electrode and the cathode-electrode are wired to each other, and the emitter-electrode and the anode-electrode are wired to each other, and when a breakdown voltage of a junction of the first region and the second region of the insulated gate bipolar transistor is represented as BVec, and a forward voltage occurring while the diode transits from a state of blocking to a state of forward conduction is represented as VF, a relationship of VF<BVec is satisfied in a predetermined current value Id of a current flowing in the diode, and the maximal doping concentration of the sixth region of the diode is higher than that of the second region of the insulated gate bipolar transistor, wherein a tenth region of the second conductivity type whose thickness is not less than 0.5 μm and not more than 3 μm and whose doping concentration is not more than $1E16 \text{ cm}^{-3}$ is provided between the sixth region and the seventh region of the diode.

5. The semiconductor device according to claim 4, wherein either one of the sixth region and the tenth region of the diode is formed by performing ion implantation from the third principal surface and irradiating the third principal surface with a laser.

6. An inverter using the semiconductor device according to claim 1.

7. An inverter using the semiconductor device according to claim 2.

8. An inverter using the semiconductor device according to claim 3.

* * * * *